United States Patent [19]

Hathaway

[11] Patent Number: 5,535,145
[45] Date of Patent: Jul. 9, 1996

[54] DELAY MODEL ABSTRACTION

[75] Inventor: David J. Hathaway, Underhill, Vt.

[73] Assignee: International Business Machines Corporation, Armonk, N.Y.

[21] Appl. No.: 383,338

[22] Filed: Feb. 3, 1995

[51] Int. Cl.$^6$ .................................................. G06F 17/50
[52] U.S. Cl. .......................... 364/578; 364/488; 395/500
[58] Field of Search .................................. 364/488, 489, 364/490, 491, 578; 395/500

[56] References Cited

U.S. PATENT DOCUMENTS

| 4,916,627 | 4/1990 | Hathaway | 364/490 |
|---|---|---|---|
| 4,924,430 | 5/1990 | Zasio et al. | 364/578 |
| 5,003,487 | 3/1991 | Drumm et al. | 364/489 |
| 5,029,102 | 7/1991 | Drumm et al. | 364/489 |
| 5,047,969 | 9/1991 | Sloane | 364/578 |
| 5,163,016 | 11/1992 | Har'El et al. | 364/578 |
| 5,163,068 | 11/1992 | El-Amawy | 357/107 |
| 5,235,521 | 8/1993 | Johnson et al. | 364/489 |
| 5,251,147 | 10/1993 | Finnerty | 364/490 |
| 5,253,161 | 10/1993 | Nemirovsky et al. | 364/402 |
| 5,262,959 | 11/1993 | Chkoreff | 364/489 |
| 5,282,147 | 1/1994 | Goetz et al. | 364/489 |
| 5,339,253 | 8/1994 | Carrig et al. | 364/489 |
| 5,392,221 | 2/1995 | Donath et al. | 364/489 |

OTHER PUBLICATIONS

Cho et al., "Redundancy identification and Removal Based on Implicit State Enumeration," IEEE, 1991, pp. 77–80.
Singh et al., "Timing Optimization of Combinational Logic," IEEE, 1988, pp. 282–285.
Cheng et al., "Multilevel Logic Optimization by Redundancy Addition and Removal," EDAC, pp. 1–5, Feb. 93.
Ott et al., "Timing in Systolic Systems with Variable Minimum Connection Delays," IEEE, pp. 2248–2251, 1990.
"Hierarchical Delay Predictor and Corrector" Jul. 1990, pp. 81–83, No. 2.

Primary Examiner—Kevin J. Teska
Assistant Examiner—Thai Phan
Attorney, Agent, or Firm—Schmeiser, Olsen & Watts; Richard M. Kotulak

[57] ABSTRACT

An abstracted delay model for a circuit network is generated wherein each internal node and connecting edges of an inputted detailed delay graph are processed. All delay edges in the delay graph which could contribute to an extreme delay path from some primary input of the delay graph are marked as necessary. Unnecessary edges are then removed to produce a partially abstracted delay graph. For each internal node in the partially abstracted delay graph, in-edges and out-edges of the node are then merged, if merging does not cause an increase in the number of edges in the delay graph, thus reducing the total number of edges in the delay abstraction.

17 Claims, 11 Drawing Sheets

DELAY MODEL ABSTRACTION

BACKGROUND OF THE INVENTION

1. Technical Field

The invention relates generally to graphs for logic networks and, more specifically, to delay model abstractions created from detailed delay models of logic networks for use with static timing analysis.

2. Background Art

A graph or "model" is a way of representing a network using nodes and edges. In hierarchical designs, abstract models are constructed to express the characteristics of components which are of interest at the higher levels of the design hierarchy in which these components are used, while hiding those characteristics which are not of interest. Thus, an abstract model is a graph that eliminates or reduces the level of detail yet maintains the model characteristics.

One notable analysis for hierarchical designs which uses abstract modeling is static timing analysis. Static timing analysis is used to determine whether a logic circuit meets a set of timing requirements by computing and propagating the worst (latest or earliest) arrival times and possibly required times through the logic network. Unlike logic simulation, no logic values are propagated. Thus the arrival and required times computed are the worst for any possible logic states, allowing a guarantee of timing correctness without having to examine an exponentially large number of cases.

The model used by static timing analysis is a directed delay graph, in which nodes represent points in the logic network at which arrival and required times are computed, propagation edges represent the delay between the points represented by two nodes, and test edges represent a timing requirement (e.g., a setup time) between the points represented by its endpoints. Excluding the test edges, the delay graph is acyclic.

A test edge determines a required time which is a least upper bound on the arrival time at one of its endpoints. At the other endpoint it determines a required time which is a greatest lower bound on the arrival time. Both types of required time are propagated backward through the propagate edges feeding the ends of the test point. In late mode timing analysis, "normal" required times (i.e., those propagated back from primary outputs, or "POs") are least upper bounds on arrival times, while in early mode timing analysis normal required times are greatest lower bounds on arrival times. One conventional method used for labeling test edges consists of calling the end of the test edge at which the required time the test contributes to is of the same type as the normal required times the data end of the test edge, and the other end the clock end of the test edge. The test edges then will be directed from the end imposing a least upper bound required time to that imposing a greatest lower bound required time. The "delay" value on the test edge is how much earlier the signal must arrive at the source end of the test than at the sink end. Although test edges are discussed as one method for indicating timing requirements, other methods, which are also commonly used by one of ordinary skill in the art, could be applied in graphing logical circuits.

To test against a least upper bound required time one should use a maximum arrival time (normal for late mode analysis), while to test against a greatest lower bound required time one should use a minimum arrival time (normal for early mode analysis).

Previous timing analyzers, such as the Early Timing Estimator (ETE), compare both types of required times against the normal type of arrival time for the analysis mode. Thus, the abstraction model does not generate both maximum and minimum delays. This is not normally a problem, since the path along which the arrival time which is not normal for the analysis mode should be propagated is generally a clock path, and these paths usually do not have converging signals, making the maximum and minimum arrival times (for a given set of delays) the same.

However, several problems do occur when the maximum and minimum arrival times are not the same and are not correctly produced in a delay abstraction. Foremost, one cannot know whether the outputs of the logic network being abstracted will feed clock or data pins of tests at the higher levels of the design in which the network is used as a component. Hence, the maximum and minimum arrival times may be different, and both would be necessary for a test edge to accurately determine required times of both the greatest lower bound and least upper bound of arrival times.

The article "Hierarchical Delay Predictor and Corrector," IBM Technical Disclosure Bulletin, No. 2, July 1990, pp.81–83; describes methods for generating abstract delay models for hierarchical designs. Only primary input (PI) and primary output (PO) nodes are used in the abstract delay graph generated by this method. Unfortunately, generating a abstract delay graph can require far more delay graph edges than needed, thus requiring more storage space. For example, if the initial delay graph were to have NPIs, each of which with an edge to a single internal node X; and M outputs, each with an edge form X; the original delay model would only have N +M edges, while the abstract delay model would have N * M edges.

Other examples of modeling hierarchical designs may be found in the following United States Patents, each incorporated herein by reference: U.S. Pat. No. 4,924,430, "Static Timing Analysis of Semiconductor Digital Circuits," (issued May 1990 to Zasio et al and assigned to Teradyne, Inc); U.S. Pat. No. 5,047,969, "General Network Modeling and Synthesis," (issued Sep. 1991 to Sloane and assigned to Schlumberger Technologies, Ltd); U.S. Pat. No. 5,163,016, "Analytical Development and Verification of Control-Intensive Systems," (issued November 1992 to Har'El et al and assigned to AT&T Bell Laboratories); U.S. Pat. No. 5,251,147, "Minimizing the Interconnection Cost of Electronically Linked Objects," (issued October 1993 to Finnerty and assigned to Digital Equipment Corp.); U.S. Pat. No. 5,253,161, "Method for Routing Data in a Near-Optimal Manner in a Distributed Data Communications Network," (issued October 1993 to Nemirovsky et al); and U.S. Pat. No. 5,262,959, "Representation and Processing of Hierarchical Block Designs," (issued Nov. 1993 to Chkoreff and assigned to Hewlett-Packard Co.).

Although each aforementioned patent provides a unique way to model a hierarchical or similar design, they do not describe using both the maximum and minimum arrival times in generating delay abstraction models. Furthermore, each method for doing static timing analysis on a delay graph share the property that the time required is linear in the number of edges in the delay graph. None of these patents address the problem of reducing the storage associated in using delay graph abstraction.

SUMMARY OF THE INVENTION

It is thus an object of the present invention to provide a delay abstraction of a logic network which generates both maximum and minimum delays, thus providing for both early and late mode analysis for a given set of delay equations.

It is another object of the invention to provide a method to reduce the number of edges in a delay abstraction, thus reducing the storage necessary for modeling the logic network.

The foregoing and other objects of the invention are realized by a delay abstraction in which each internal node and connecting edges of a detailed delay graph are included in the abstraction process. Each propagate edge is marked as contributing to maximum paths, minimum paths, or both. Unnecessary or non-contributing edges are reduced or eliminated through identifying and eliminating non-required internal paths. The remaining necessary edges are then merged wherever possible to reduce the total number of edges in the delay abstraction.

BRIEF DESCRIPTION OF DRAWINGS

The foregoing and other objects, features and advantages of the invention will be apparent from the following more particular description of preferred embodiments of the invention, as illustrated in the accompanying drawings.

DETAILED DESCRIPTION OF THE BEST MODE FOR CARRYING OUT THE INVENTION

Figure 1:
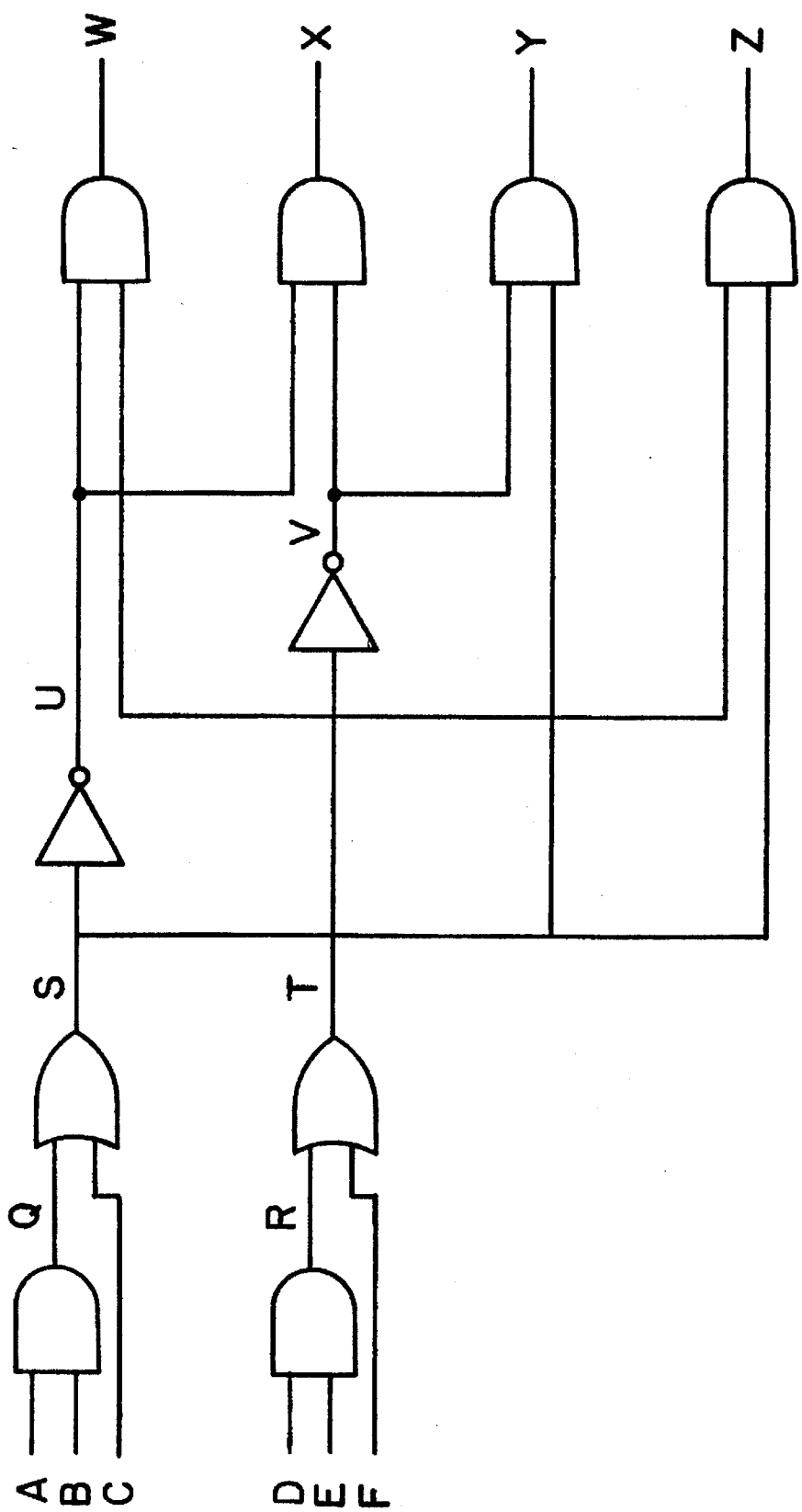
FIG. 1 is a schematic example of a logic network operated upon by the present invention.

With reference to FIG. 1, there is shown an example of a logic network design which may be used for delay abstraction as described in the present invention. The logic network includes primary inputs (PIs) A, B, C, D, E, and F; primary outputs (POs) W, X, Y and Z; and other points Q, R, S, T, U, and V at which arrival and required times are computed along with the PIs and POs. A and B are coupled to a first AND gate which is then coupled with C to a first OR gate. Likewise, D and E are coupled to a second AND gate which couples with F to a second OR gate. Points Q and R are located at the outputs of the first and second AND gates, respectively, and S and T are located at the outputs of the first and second OR gates, respectively. The OR gates are then coupled to a second level of AND gates. Inverters located between the OR gates and second level of AND gates provide all possible logic states of the OR gates' outputs to the second level of AND gates. Points U and V are located at the outputs of the inverters, and POs W, X, Y, and Z are located at the outputs of the second level of AND gates.

As aforementioned, the arrival and required times computed are the worst for any possible logic states, hence no logic values for this or any network need to be propagated for timing correctness.

Figure 2:
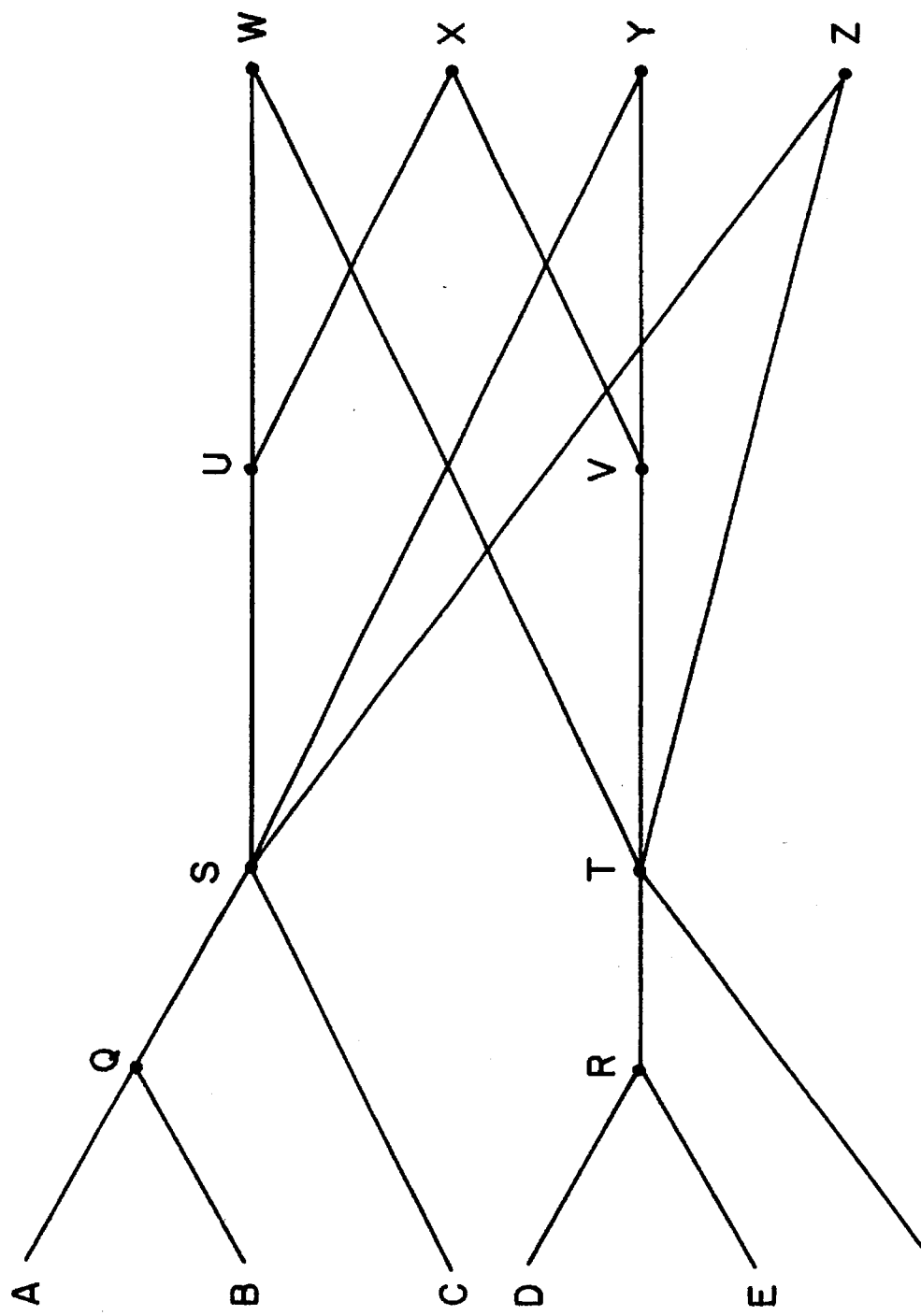
FIG. 2 is the detailed delay graph of FIG. 1.

The detailed delay graph of the logic network is shown in FIG. 2. The nodes A–F and Q–Z represent their corresponding points A–F and Q–Z in the logic network (FIG. 1). These nodes are connected by edges which represent the delay between the nodes. Eighteen delay edges exist in this detailed delay graph, from which paths are formed to the POs from the PIs. Since there is no reconvergence of paths in this example, the delay of each edge will be ignored.

Figure 3:
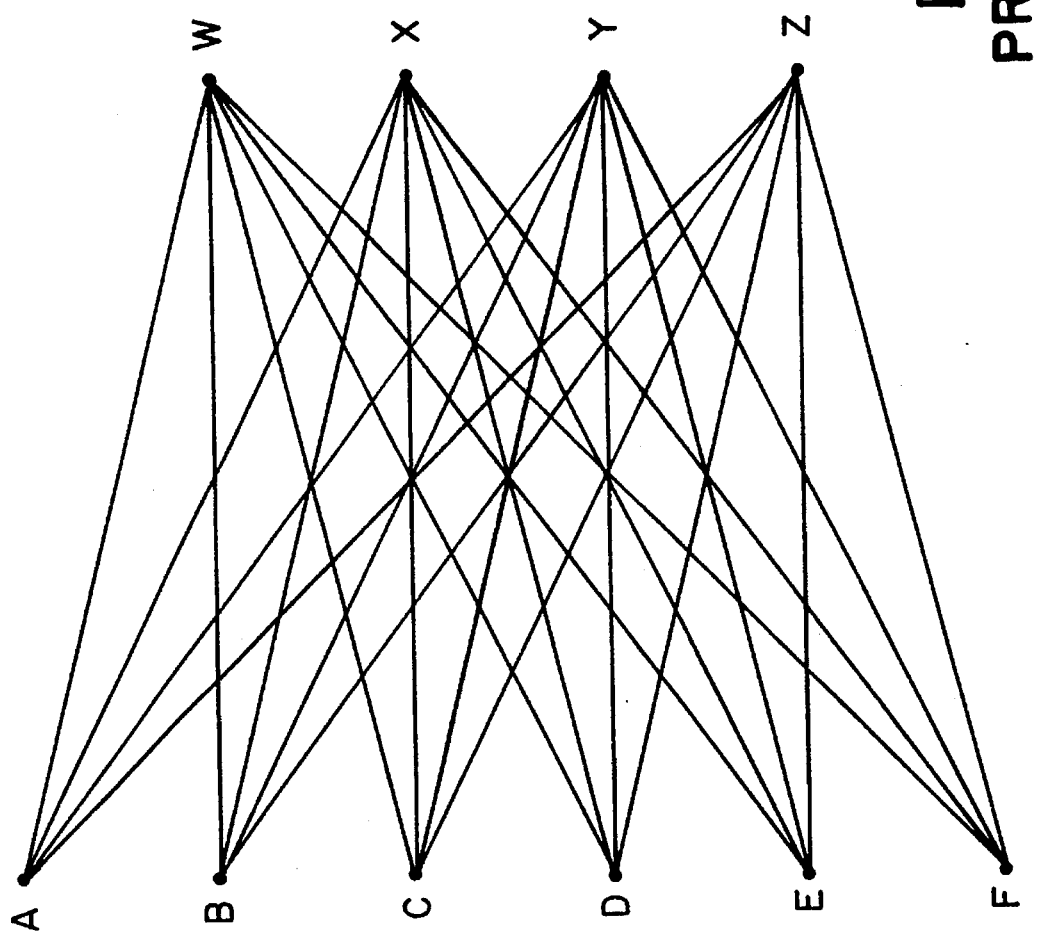
FIG. 3 is the prior art abstracted delay graph of FIG. 1.

The prior art delay abstraction graph is shown in FIG. 3. Only the PI and PO nodes are used in generating its abstracted delay edges. Thus, a total of 24 delay edges are generated (six input nodes multiplied by four output nodes).

Figure 4:
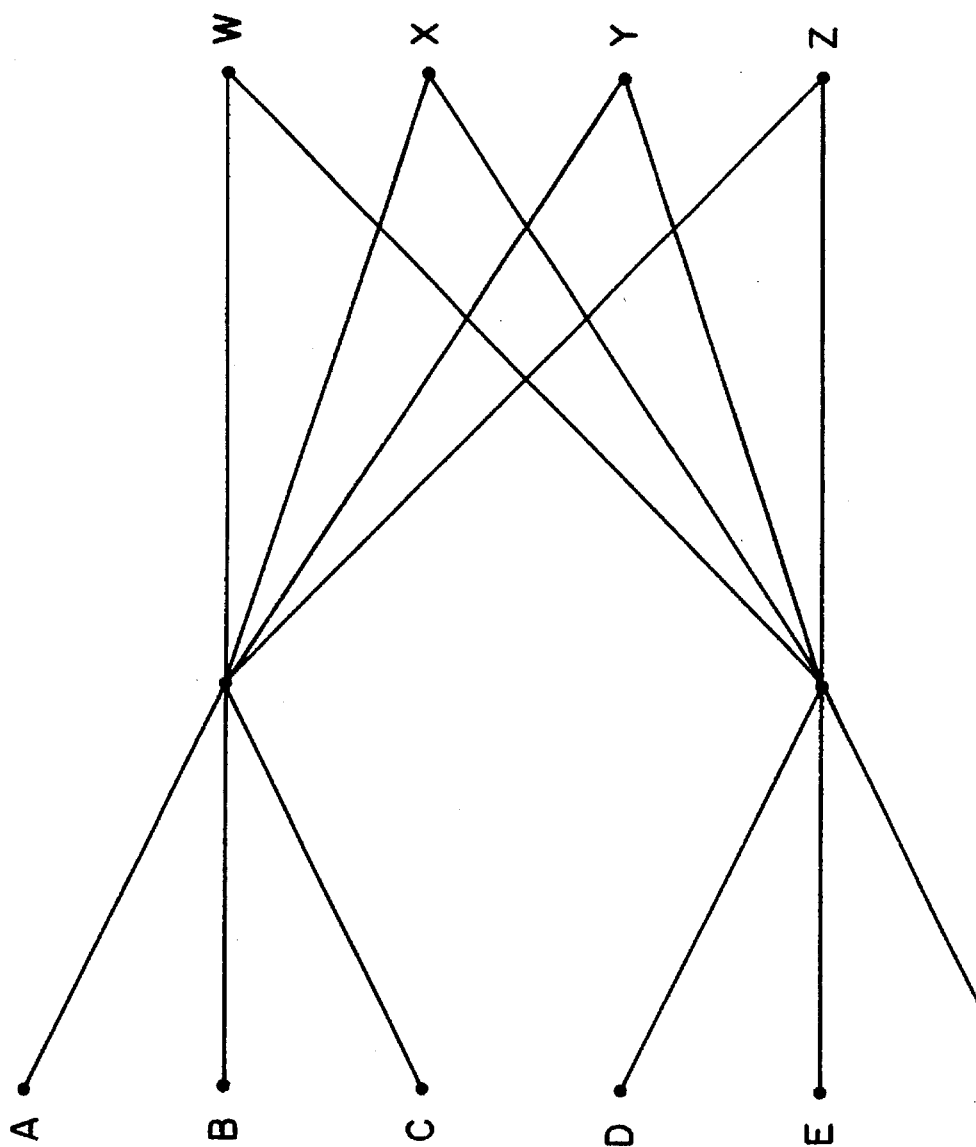
FIG. 4 is the abstracted delay graph of FIG. 1 as described in the present invention.

FIG. 4 represents the present invention's abstracted delay graph after the steps of eliminating and merging edges takes place (explained hereinbelow through subsequent examples). In this case, only 14 delay edges are needed to accurately represent the logic network. The potential reduction of delay edges is significant when comparing the prior art abstraction method to the present invention's abstraction method.

Figure 5:
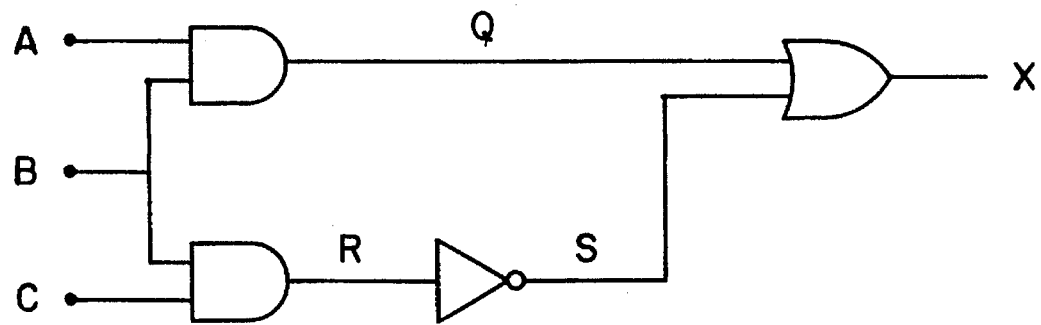
FIG. 5 is a second schematic example of a logic network operated upon by the present invention.
Figure 6:
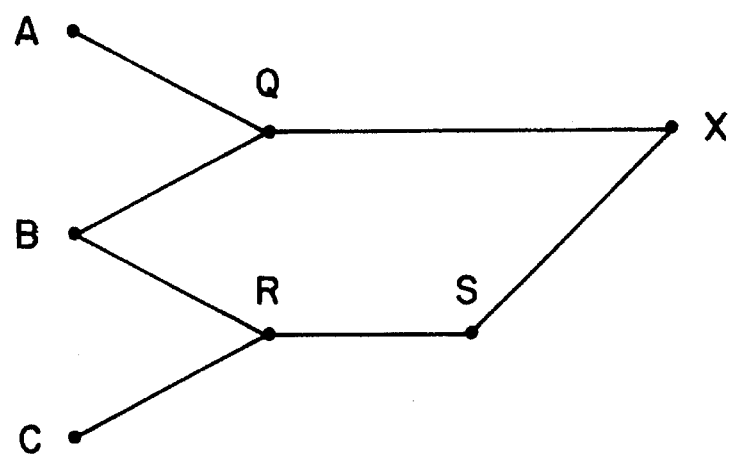
FIG. 6 is the detailed delay graph of FIG. 5.

A second example of a logic network is depicted in FIG. 5. PIs A, B, and C are inputs into a first and second AND gate. The output of the first AND gate and the inverted output of the second AND gate are then coupled to an OR gate, wherein PO X is outputted. Points Q and R are located at the outputs of the first and second AND gates, and point S, at the output of the inverted AND gate signal.

The detailed delay graph as shown in FI6. 6 displays the nodes A, B, C, Q, R, S, and X which correspond to the points on the network (FIG. 5). In this example, all delay edges are equal to one, and only maximum delays are considered. Paths B-Q-X, and B-R-S-X are reconvergence paths.

In the present invention, the first step in generating an abstracted delay graph involves eliminating unnecessary edges of the detailed delay graph. In this step, all portions of the original delay graph which have no influence on the externally measurable delay characteristics of the logic network are eliminated, creating a partially abstracted delay graph. Since the relative arrival times of the PIs of the logic network in the timing analyses which will use the delay abstraction are not known, an abstraction is created which will be correct for any set of relative arrival times.

Each PI is examined in turn to determine which edges are required to represent all maximal and minimal paths from the PI. Then, the maximum and minimum arrival time equations are propagated forward from the PI, and at each node encountered during this propagation, the in-edge(s) causing the maximum and minimum retained arrival time (the extreme arrival times) at that node is (are) marked as potentially necessary forward, maximum and potentially necessary forward, minimum, respectively (in this example, only potentially necessary forward, maximum will be examined and marked potentially necessary forward). These marked edges represent the delay edges which could contribute to an extreme delay path from some primary input of the delay graph.

Figure 7A:
FIGS. 7A, 7B, and 7C are potentially necessary edges taken from points A, B, and C of FIG. 6 as described in the present invention.
Figure 7B:
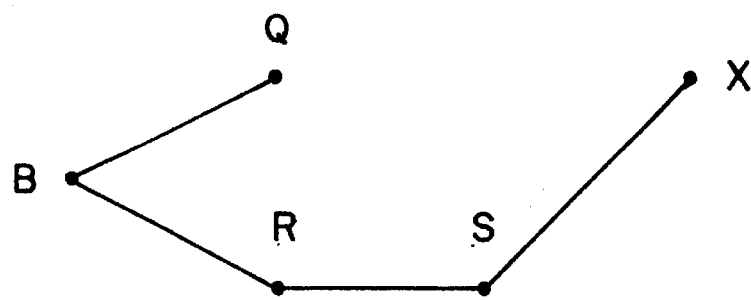
Figure 7C:
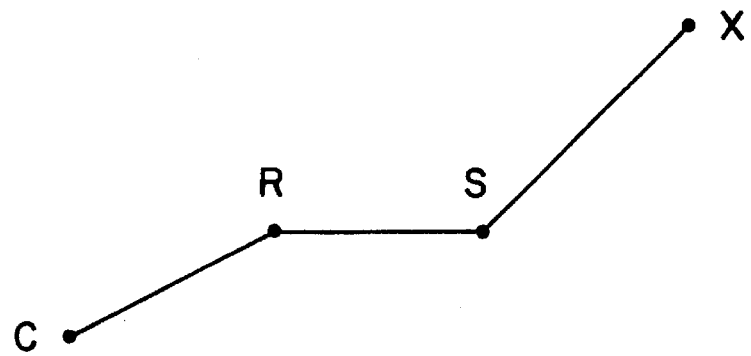

FIGS. 7A–7C show the potentially necessary forward edges from A, B, and C, respectively. The POs reached in this forward propagation (i.e., those POs for which paths exist from the current PI) are kept in a reachable PO list.

The delays, test values, arrival times, and required times may be either fixed numerical values, or mathematical functions dependent on some environmental parameters which are defined outside the network being abstracted. For example, a delay value might be a function of the slew time (or signal slope) at some PI, and/or of the temperature at which the network operates.

When functions are used, the addition, subtraction, and comparison of delays, tests, and times must be performed appropriately. In particular, the comparison of two time functions may not result in either of them being greater than the other over the functions' entire domain.

Multiple in-edges may cause the retained arrival time at a node if none of the arrival time functions propagated along them is strictly greater over their domains. Thus multiple in-edges of a node may also be marked.

Figure 8:
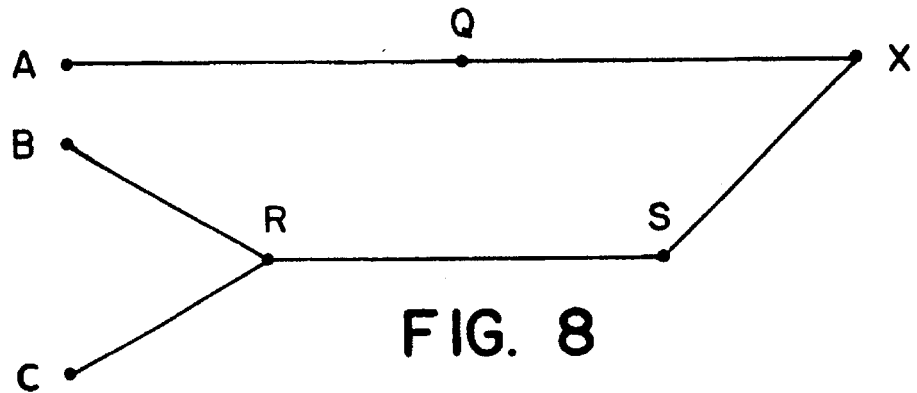
FIG. 8 is the necessary edges of FIG. 6 as described in the present invention.

For each PO in the reachable POs list we now trace backward along the edges marked as potentially necessary forward and mark them as necessary. FIG. 8 shows the necessary edges obtained from the marked potentially necessary forward edges that are needed in the delay graph. Before proceeding to the next PI, the potentially necessary forward, minimum/maximum marks and the reachable POs lists are cleared.

After all the PIs have been processed, all edges which are not marked as necessary are removed from the delay graph, and all nodes which are not PIs or POs and which have no edges remaining incident on them are also removed. The edge B-Q (shown in FIG. 7B) was not necessary because it was not reachable in a backwards trace from X along potentially necessary edges, and thus in FIG. 8, B-Q was eliminated.

Several variations for the process of eliminating edges in the present invention are possible. One such variation deals with using lists on nodes instead of marks on edges to indicate edges which are potentially necessary. The potentially necessary forward marks would be replaced by lists of the in-edges to each node which would be so marked, and the potentially necessary backward marks would be replaced by lists of the out-edges and test edges to each node which would be so marked.

Another variation consists of using separate necessary, maximum and necessary, minimum marks for those edges which had been marked potentially necessary forward, maximum, and those which had been marked potentially necessary forward, minimum when marking edges as necessary. Separate necessary marks can also be used for those edges marked during the processing of each PI.

Each of these variations has the effect of dividing the necessary edges incident on a node into overlapping groups, in order to reduce the number of new edges which must be formed when and if any or all of the edges incident on a vertex are merged. However, using more separate marks also increases the amount of storage required for those marks, and increases the time required by (but not the order of complexity of) the algorithm.

The next step in forming an abstraction delay graph as disclosed in the present invention consists of merging the edges. In this step, edges are combined wherever possible to reduce the total number of edges in the delay abstraction.

Figure 9:
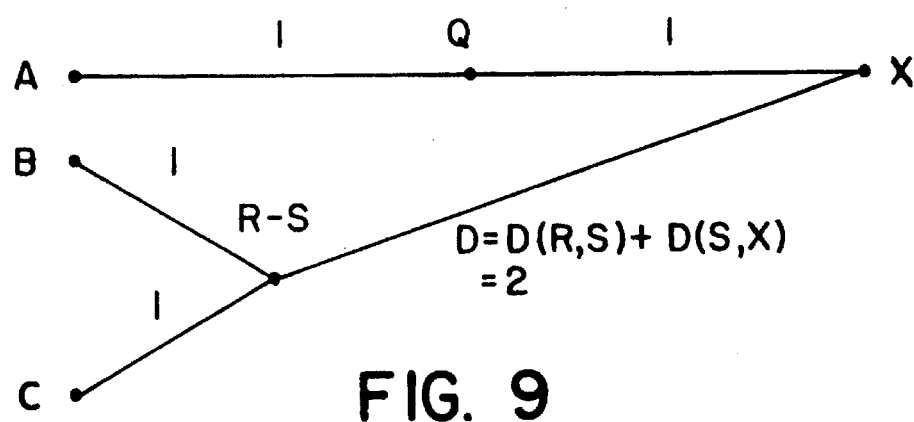
FIGS. 9, 10, and 11 display edge merging of FIG. 8.
Figure 10:
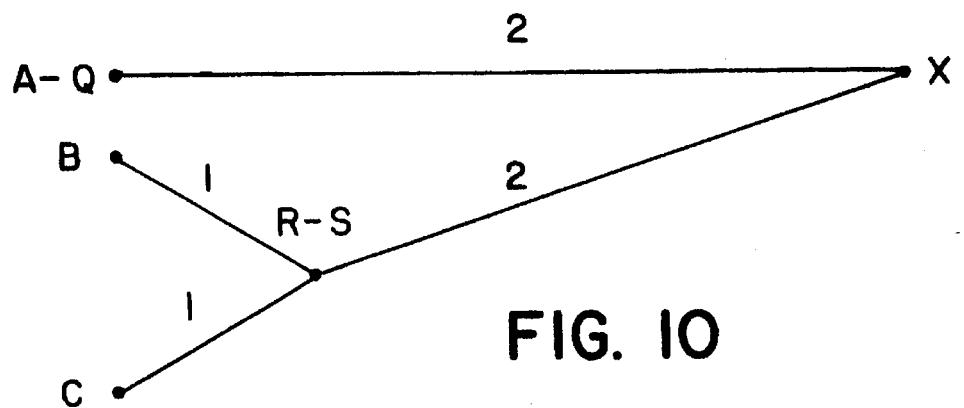
Figure 11:
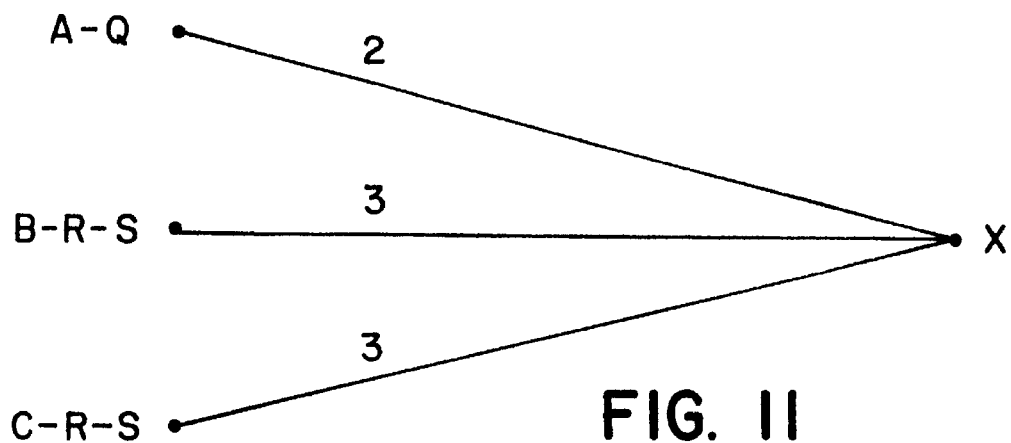

Combining propagation edges (in- and out-edges of a node) is shown in FIGS. 9, 10, and 11. At nodes (other than PIs and POs) with either a single in-edge or a single out-edge, the node and its incident edges are removed, and new edges are created from the source of each in-edge to the sink of each out-edge with equations that are combinations of the in-edge and out-edge equations. This removes one edge and one node from the delay graph.

Because this merging step does not change the number of edges incident on any node, it can be performed in a single pass through the nodes of the delay graph. After this step, each node (except PIs and POs) will have at least two in-edges and least two out-edges.

At nodes with exactly two in-edges and two out-edges, the node and its incident edges are removed, and new edges are created from the source of each in-edge to the sink of each out-edge with equations which are the combination of the in-edge and out-edge equations. Performing this merging step does not reduce the number of edges, but it does remove a node from the delay graph. While performing this merging step on this one node may prevent it from being performed at some other node, doing so cannot allow it to be performed at a node where it previously would have not been allowed. Thus, it can also be performed in a single pass through the nodes of the delay graph.

FIG. 9 shows edges R-S and S-X being merged, forming a delay equation $D(R,S)+D(S,X)$, which may be a function of various parameters of the network (e.g., the output load capacitance or input slew time of a network). Edges A-Q and Q-X are then merged as shown in FIG. 10, and edge (R-S)-X is merged with edges B-(R-S) and C-(R-S) as shown in FIG. 11.

A slight variation for merging edges is performed if the necessary marks on edges are divided into groups, as described in the variation of the previous step. In this case, we may be able to merge a subset of the edges incident on a node. The requirement is that to remove a given in-edge (out-edge) E with a set of necessary marks M, new edges must be formed by merging E with each of the out-edges (in-edges) having any of the necessary marks in M. The marks on the resulting edges are the intersection of those on the merged edges.

Under these constraints, edges will be merged at a node only if doing so reduces the number of edges in the delay graph, or eliminates the node and does not increase the number of edges in the delay graph.

Figure 12:
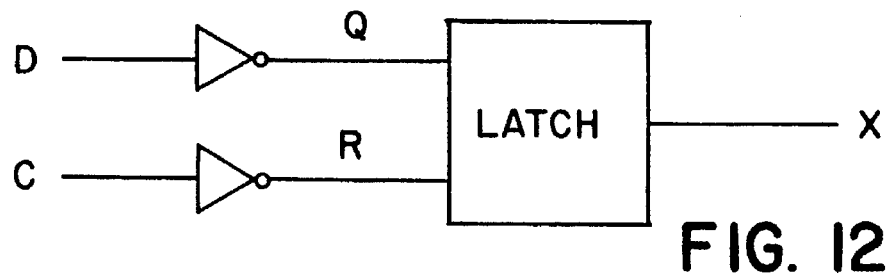
FIG. 12 is a third schematic example of a logic network operated upon by the present invention.

A third example of a logic network is shown in FIG. 12. PIs D and C are inputs into a first and second inverter. The outputs of the inverters are then fed into a latch which then outputs PO X. Points Q and R are located at the outputs of the first and second inverters.

Figure 13:
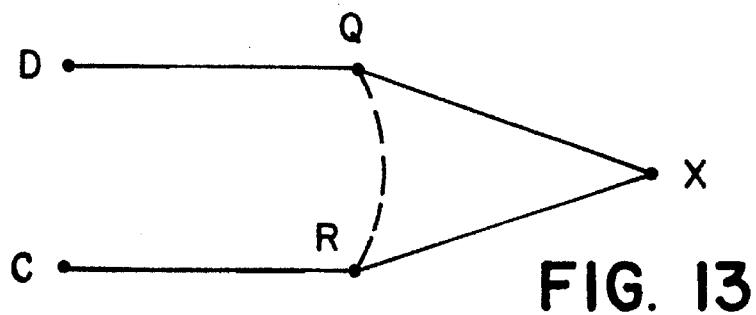
FIG. 13 is the detailed delay graph of FIG. 12.

The detailed delay graph as shown in FIG. 13 consists of nodes D, C, Q, R, and X, each corresponding to the points of the logic network (FIG. 12). The dotted line between nodes Q and R represents a test edge. As aforementioned, although in this example, a test edge is used which is directed from the end imposing a least upper bound required time to that imposing a greatest lower bound required time, other means that are well-known in the art may also be used for indicating and graphing timing requirements in a logical circuit for the present invention.

Figure 14A:
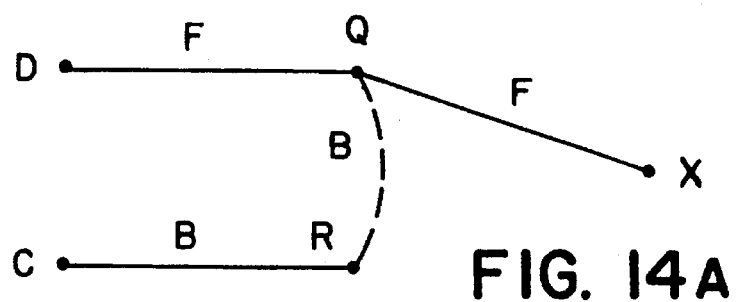
FIG. 14A and 14B are potentially necessary edges taken from points D and C, respectively, of FIG. 13 as described in the present invention.
Figure 14B:
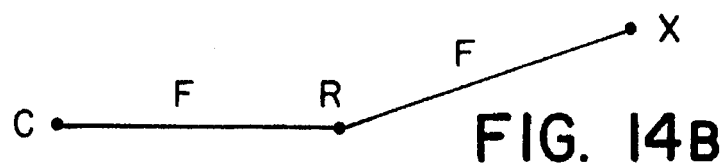

FIGS. 14A and 14B show the potentially necessary edges from D and from C, respectively. To include the effects of test edges in the generated delay abstraction in eliminating unnecessary edges, we must also trace paths from a PI, to and through a test edge, and back to other PIs. But since the constraint imposed by the test edge is the same in each direction (except for sign), we need only need to traverse them in one direction; we will do so from source to sink. Therefore, when the source end of a test edge is reached during the propagation of maximum arrival times from the PI, we begin a backward propagation of greatest lower bound required times from the sink end of the test edge. At each node encounter in this backward propagation, the out-edge(s) and/or test edge(s) causing the retained (maximum) required time at that node are marked as potentially necessary backward. The PIs reached in this backward propagation (i.e., those PIs for which paths through a test edge, from source to sink, exist from the current PI) are kept in a reachable PI list. In FIGS. 14A and 14B, the "F" represents a forward propagation, and the "B" represents a backward propagation.

Multiple test edges may cause the retained required time at a node if none of the required time functions propagated along them is strictly greater over their domains. Thus multiple test edges of a node may be marked.

When the sink end of a test edge marked potentially necessary backward is encountered, that test edge is marked as necessary and from its source end we now trace backward along the edges marked as potentially necessary forward, maximum and mark them as necessary. In this third example, all potentially necessary edges shown in FIGS. 14A and 14B are marked necessary.

For the merging of edges, both the source and sink end of test edges are treated as out-edges of the node in the steps aforementioned in which in-edges and out-edges of a node are combined. This is because paths through a test edge proceed through in-edges of the nodes at both its ends, and so the test edge can be combined only with in-edges.

Combining a propagation edge with a test edge at the source end of the test is done by adding the propagation edge delay equation with a test edge equation and combining a propagation edge with a test edge at the sink end of the test is done by subtracting the propagation edge delay equation from the test edge equation. A combination propagation edge and a test edge always forms a test edge, oriented in the direction of the original test edge.

Figure 15:
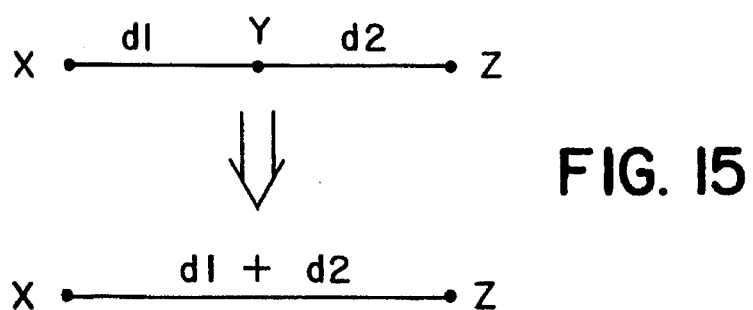
FIGS. 15, 16, and 17 are merging of test and non-test edges as described in the present invention.
Figure 16:
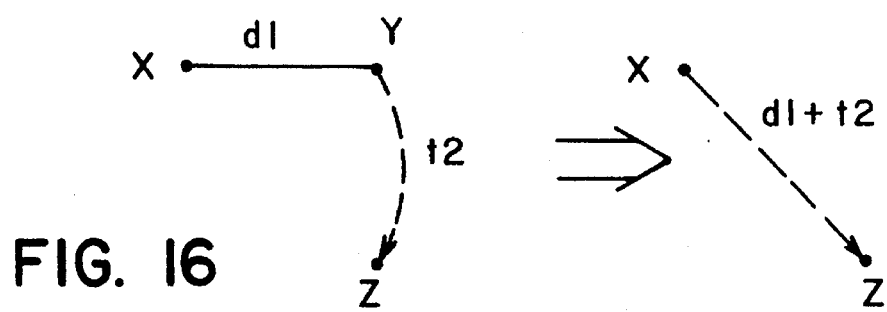
Figure 17:
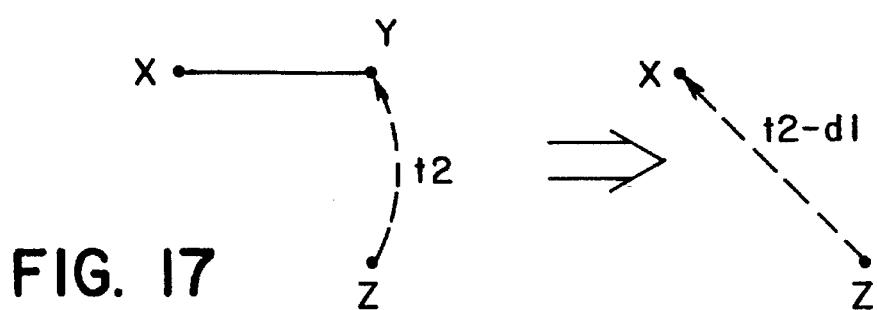

The merging of non-test and test edges are further clarified in FIGS. 15–17. The merging of a non-test edge is shown in FIG. 15 whereas node Y is eliminated and edges d1 and d2 are merged into edge d1+d2. That is, the delay associated with the new edge (d1+d2) is the sum of delays for all edges (d1 and d2) being merged. FIGS. 16 and 17 show the new edges which result from merging a test and non-test edge. FIG. 16 shows the combining of the non-test edge (d) with a test edge (t2) at the source end of the test edge, resulting in the new edge d1+t2. In FIG. 17, since the non-test edge (d1) is now combined with the sink end of the test edge (t2), the new edge is obtained by subtracting the non-test edge equation from the test edge equation (t2–d1).

If in the initial step of making necessary edges it was possible that multiple edges could cause the required or arrival time at a node, there may now be cases of parallel edges with the same source and sink nodes. If the form of the delay equation allows it, these may be combined into a single-edge with a new delay equation (e.g., the maximum of the two for late mode analysis). This could in turn be followed by another pass of edge merging since the number of edges incident on nodes may have been reduced, providing additional opportunity for edge merging.

Figure 18:
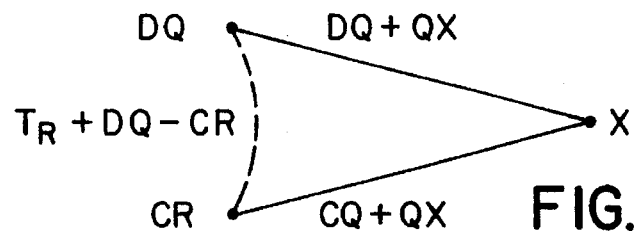
FIG. 18 is the abstracted delay graph of FIG. 12 as described in the present invention.

FIG. 18 shows the abstract model for the third example. On the original test edge Q-R it is required that $A_q \leq A_r - T_{qr}$, the abstracted edge now requires $A_{dq} \leq A_{cr} - T_{dq-cr}$.

Figure 19:
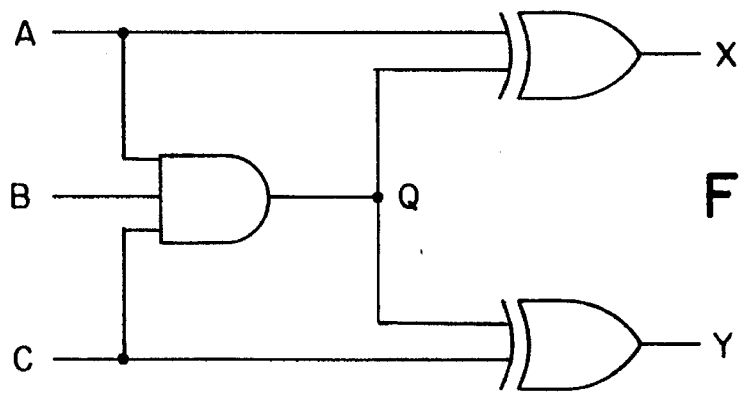
FIG. 19 is a fourth schematic example of a logic network operated upon by the resent invention.

A fourth example of a logic network shown in FIG. 19 demonstrates the more complex merging method in which separate necessary marks are kept for each primary input, allowing in some cases (like node Q in this example) the merging of edges even when the number of in-edges multiplied by the number of out-edges is greater than the number of in-edges added to the number of out-edges (e.g. the number of in-edges is greater than 2 and the number of out-edges is greater than 1, or the number of in-edges is greater than 1 and the number of out-edges is greater than 2). In this example, PIs A, B and C are inputs into an AND gate, wherein the output of the AND gate combines with A to feed a first NOR gate outputting PO X, and combines with C to feed a second NOR gate outputting PO Y. Point Q is located at the output of the AND gate.

Figure 20:
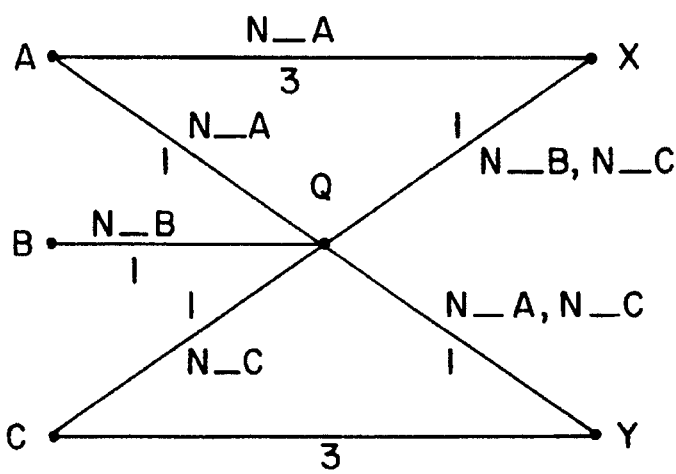
FIG. 20 is the detailed delay graph of FIG. 16.

The detailed delay graph as shown in FIG. 20 consists of nodes A, B, C, Q, X, and Y, each corresponding to the points of the logic network (FIG. 19). N_j indicates that particular edge is necessary from PI j. Again, only maximum delays will be considered in this example.

Figure 21:
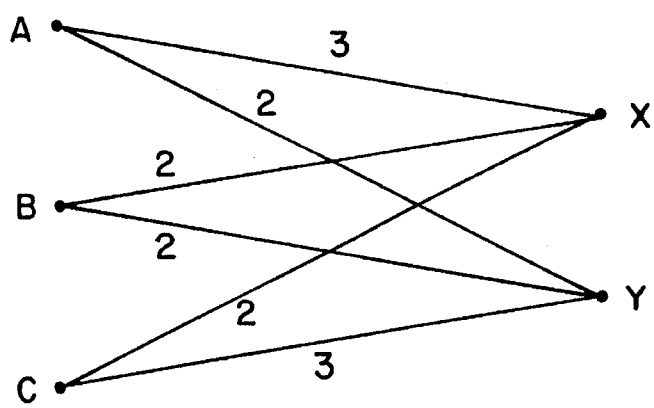
FIG. 21 is the abstracted delay graph of FIG. 16 as described in the present invention.

FIG. 21 shows the abstracted delay graph wherein Q may be removed even though the number of in-edges multiplied by the number of out-edges is greater than the number of in-edges added to the number of out-edges (i.e. 3*2>3+2). No reduction of the delay graph would have been possible if separate necessary marks were not kept for each primary input and divided into groups.

Figure 22:
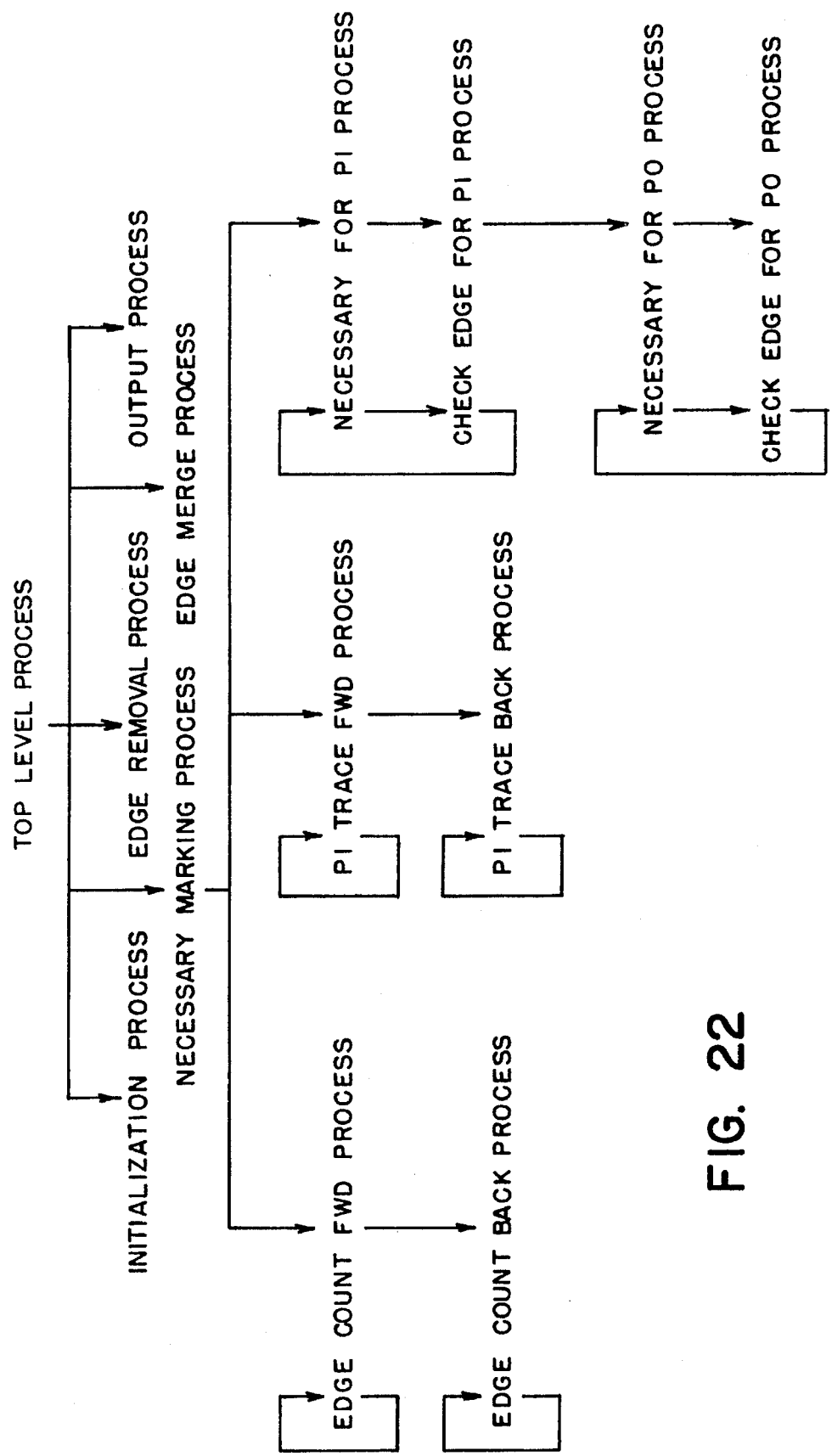
FIG. 22 is a process decomposition of the present invention.

FIG. 22 depicts the process decomposition of the method of creating an abstraction delay graph from a detailed delay graph which was described throughout the examples aforementioned and is outlined hereinbelow.

TOP_LEVEL_PROCESS

Execute INITIALIZATION_PROCESS

Execute NECESSARY_MARKING_PROCESS

Execute EDGE_REMOVAL_PROCESS

Execute OUTPUT_PROCESS

INITIALIZATION_PROCESS

Input detailed delay graph

If we are using the "split necessary conditions variation"
{
      Associate a NECESSARY list (initially empty) of (primary-input, MIN/MAX, FWD/BACK) triples with each edge in the delay graph.
}
else
{
      Associate a NECESSARY flag (initially cleared) with each edge in the delay graph.
}

NECESSARY_MARKING_PROCESS

Associated with each node allocate variables:
      IN_EDGE_COUNT                      (integer)

OUT_EDGE_COUNT                          (integer)

ARR_MIN                                 (time)

ARR_MAX                                 (time)

REQ                                     (time)

POTENTIALLY_NECESSARY_FWD_MAX           (edge-identifier)

POTENTIALLY_NECESSARY_FWD_MIN           (edge-identifier)

POTENTIALLY_NECESSARY_BACK              (edge-identifier)

Associate with each primary input and primary output a REACHABLE flag (initially cleared)

For each primary input X
{
    Set all POTENTIALLY_NECESSARY_... variables to NO_EDGE on all nodes.

Set IN_EDGE_COUNT and OUT_EDGE_COUNT values on all nodes to 0.

Set ARR_MIN value on all nodes to +infinity.

Set ARR_MAX and REQ values on all nodes to -infinity.

Set ARR_MIN (X) and ARR_MAX (X) = 0.

Execute EDGE_COUNT_FWD_PROCESS (X)

Execute PI_TRACE_FWD_PROCESS (X)

For each primary output Y marked REACHABLE execute
NECESSARY_FOR_PO_PROCESS (Y,X)

For each primary input Y marked REACHABLE execute
NECESSARY_FOR_PI_PROCESS (Y,X)

}

EDGE_COUNT_FWD_PROCESS (X)

For each out-edge E of X
{
    If E is a test-edge
    {
        Increment OUT_EDGE_COUNT (sink node of E)

If OUT_EDGE_COUNT (sink node of E) = 1
        {
            Execute EDGE_COUNT_BACK_PROCESS (sink node of E)
        }
    }
}

```
        else
        {
                Increment IN_EDGE_COUNT (sink node of E)

If IN_EDGE_COUNT (sink node of E) = 1
                {
                        Execute EDGE_COUNT_FWD_PROCESS (sink node of E)
                }
        }
}
```

EDGE_COUNT_BACK_PROCESS (X)

```
For each in-edge E of X that is not a test-edge
{
        Increment OUT_EDGE_COUNT (source node of E)

If OUT_EDGE_COUNT (source node of E) = 1
        {
                Execute EDGE_COUNT_BACK_PROCESS (source node of E)
        }
}
```

PI_TRACE_FWD_PROCESS (X)

```
If IN_EDGE_COUNT (X) <= 0
{
    For each in-edge E of X that is not a test-edge
    {
        If ARR_MIN (source of E) + DELAY_MIN (E) < ARR_MIN (X)
        {
            APR_MIN (X) = APR_MIN (source of E) + DELAY_MIN (E)

Set POTENTIALLY_NECESSARY_FWD_MIN (X) to E
        }
        If ARR_MAX (source of E) + DELAY_MAX (E) > ARR_MAX (X)

{
            APR_MAX (X) = APR_MAX (source of E) + DELAY_MAX (E)

Set POTENTIALLY_NECESSARY_FWD_MAX (X) to E
        }
    }
    For each out-edge E of X
    {
        If E is a test-edge
        {
            Decrement OUT_EDGE_COUNT (sink of E)
```

Execute PI_TRACE_BACK_PROCESS (sink of E)
        }
        else
        {
                Decrement IN_EDGE_COUNT (sink of E)

Execute PI_TRACE_FWD_PROCESS (sink of E)
        }
    }
}

PI_TRACE_BACK_PROCESS (X)

If OUT_EDGE_COUNT (X) <= 0
{
        For each out-edge E of X that is not a test-edge
        {
                If REQ (sink of E) + DELAY_MIN (E) > REQ (X)
                {
                        REQ (X) = REQ (sink of E) - DELAY_MIN (E)

Set POTENTIALLY_NECESSARY_BACK (X) to E
                }
        }
        For each in-edge E of X that is a test-edge

```
        {
                If REQ (source of E) + TEST (E) > REQ (X)
                {
                        REQ (X) = REQ (source of E) - TEST (E)

Set POTENTIALLY_NECESSARY_BACK (X) to E
                }
        }
        For each in-edge E of X that is not a test-edge
        {
                Decrement OUT_EDGE_COUNT (source of E)
                Execute PI_TRACE_BACK_PROCESS (source of E)
        }
}
```

NECESSARY_FOR_PO_PROCESS (X, PI)

Execute CHECK_EDGE_FOR_PO (POTENTIALLY_NECESSARY_FWD_MIN (X), PI, MIN)

Execute CHECK_EDGE_FOR_PO (POTENTIALLY_NECESSARY_FWD_MAX (X), PI, MAX)

CHECK_EDGE_FOR_PO (EDGE, PI, MIN_OR_MAX)

If EDGE is not NO_EDGE

{

If we are using the "split necessary conditions variation"

{

If (PI, MIN_OR_MAX, FWD) is not on the NECESSARY list for EDGE

{

Add (PI, MIN_OR_MAX, FWD) to the NECESSARY list for EDGE

Execute NECESSARY_FOR_PO_PROCESS (source node of EDGE, PI)

}

} else

{

If EDGE is not marked as NECESSARY

{

Mark EDGE as NECESSARY

Execute NECESSARY_FOR_PO_PROCESS (source node of EDGE, PI)

}

}
}

NECESSARY_FOR_PI_PROCESS (X, PI)

Execute CHECK_EDGE_FOR_PI
(POTENTIALLY_NECESSARY_BACK (X), PI, MAX)

CHECK_EDGE_FOR_PI (EDGE, PI, MIN_OR_MAX)

If EDGE is not NO_EDGE
{
    If we are using the "split necessary conditions variation"
    {
        If (PI, MIN_OR_MAX, BACK) is not on the NECESSARY list for EDGE
        {
            Add (PI, MIN_OR_MAX, BACK) to the NECESSARY list for EDGE If EDGE is a test-edge
            {
                Execute NECESSARY_FOR_PO_PROCESS (source node of EDGE, PI)

```
                    }
                    else
                    {
                            Execute NECESSARY_FOR_PI_PROCESS (sink node
                            of EDGE, PI)
                    }
            }
        }
    }
    else
    {
            If EDGE is not marked as NECESSARY
            {
                    Mark EDGE as NECESSARY If EDGE is a test-edge
                    {
                            Execute NECESSARY_FOR_PO_PROCESS (source
                            node of EDGE, PI)
                    }
                    else
                    {
                            Execute NECESSARY_FOR_PI_PROCESS (sink node
                            of EDGE, PI)
                    }
            }
```

}
}

EDGE_REMOVAL_PROCESS

If we are using the "split necessary conditions variation"

{

Remove all edges for whose NECESSARY list is empty

}
else
{

Remove all edges for which the NECESSARY flag is not set

}

EDGE_MERGE_PROCESS

For each internal node X

{

If we are using the "split necessary conditions variation"

{

Note: in this section "in-edge" will mean non-test in-edge, and "out-edge" will mean out-edge or test-in-edge. And (PI, BACK, MAX) and (PI, BACK, MIN) NECESSARY marks on out-test-edges will be considered to match (PI, FWD, MIN) and (PI, FWD, MAX) NECESSARY marks, respectively, on in-edges.

Set PROCESSED flag to false for all edges incident on X

For in-edge E of X for which PROCESSED flag is not set
{
    Set MARKS_BEING_PROCESSED to the NECESSARY set of E Create set EDGES_BEING_PROCESSED with single element E Set PROCESSED flag on E

EDGES_ADDED = TRUE

While (EDGES_ADDED)
    {
        EDGES_ADDED = FALSE

For each in-edge E2 of X for which PROCESSED flag is not set
        {
            If any NECESSARY marks on E2 match any in

```
                MARKS_BEING_PROCESSED
            {
                    EDGES_ADDED = TRUE

Set PROCESSED flag on E2

Add to MARKS_BEING_PROCESSED
                    all NECESSARY marks on E2

Add E2 to
                    EDGES_BEING_PROCESSED
            }
        }
}
EDGES_REMOVED = 0

EDGES_ADDED = 0

For each out-edge EO in EDGES_BEING_PROCESSED
{
        Increment EDGES_REMOVED
}
For each in-edge EI in EDGES_BEING_PROCESSED
{
        Increment EDGES_REMOVED
```

```
For each out-edge EO in

EDGES_BEING_PROCESSED

{

If EI and EO share any NECESSARY marks

{

Increment EDGES_ADDED

}

}

}

If EDGES_ADDED <= EDGES_REMOVED

{

For each in-edge EI in EDGES_BEING_PROCESSED

{

For each out-edge EO in

EDGES_BEING_PROCESSED

{

If EI and EO share any NECESSARY marks

{

Create a new edge from EI and

EO

}

}

}

Remove all edges in EDGES_BEING_PROCESSED
```

```
                }
            }
        }
        else
        {
            let I = the set of non-test in-edges of X let O = the set of test-edges incident on X plus the non-test out-edges
            of X If the number of edges in I * the number of edges in O <= the number
            of edges in I + the number of edges in O
            {
                Create a new edge for every pair of I and O edges Delete node X and al edges incident on it (all edges in I and O)
            }
        }
}
```

OUTPUT_PROCESS

Output abstracted delay graph

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A delay abstraction system for a circuit network comprising:
   a) an input device for inputting an original delay graph of said circuit network;
   b) a marking device for marking with at least one type of necessary mark all delay edges in said original delay graph which contribute to at least one extreme delay path, each said path having a delay and originating from a primary input of said original delay graph and proceeding through, said circuit network;
   c) a removing device for removing from said original delay graph all delay edges not marked as necessary by said marking device to produce a partially abstracted delay graph, wherein said partially abstracted delay graph includes at least one internal node having at least one in-edge and at least one out-edge from said marked delay edges;
   d) a merging device for merging said at least one in-edge with at least one out-edge of said internal node, said out-edge having at least one of the same said type of necessary mark as said in-edge, in said partially abstracted delay graph to form a new edge, if merging by said merging device decreases the number of said delay edges in said partially abstracted delay graph, to produce an abstracted delay graph, wherein said delay of each of said at least one extreme delay path is preserved; and
   e) an outputting device for outputting said abstracted delay graph.

2. A system according to claim 1 wherein said original delay graph comprises test-edges which merge with said in-edges, and said merging device further comprises a test-edge merging device for merging said in-edges with said test-edges.

3. A system according to claim 1 wherein said merging device further comprises an edge device for creating a new edge for an in-edge/out-edge pair at each said internal node, and a connecting device for connecting said new edge from a source of said in-edge being merged to a sink of said out-edge being merged.

4. A system according to claim 3 wherein a delay associated with said new edge is a sum of delays for all edges being merged.

5. A system according to claim 1 wherein said marking device further comprises an arrival propagating device for propagating arrival times forward from each said primary input, a potential marking device for marking as potentially necessary said in-edges to a node which cause an extreme arrival time at said node, and a necessary marking device for marking as necessary edges which are included in a path to a primary output, said path to said primary output being composed only of edges marked potentially necessary.

6. A system according to claim 5 wherein said marking device further comprises an applying device for applying separate necessary marks to edges necessary for a maximum delay path and to edges necessary for a minimum delay path; and said merging device further comprises an edge device for creating a new edge for an in-edge/out-edge pair at each said internal node which both have same said necessary marks, and a connecting device for connecting said new edge from a source of said in-edge being merged to a sink of said out-edge being merged.

7. A system according to claim 5 wherein said marking device further comprises an applying device for applying separate necessary marks to edges necessary for said extreme delay path from each said primary input; and
   said merging device further comprises an edge device for creating a new edge for an in-edge/out-edge pair at each said internal node which both have same said necessary marks, and a connecting device for connecting said new edge from a source of said in-edge being merged to a sink of said out-edge being merged.

8. A system according to claim 2 wherein said marking device further comprises:
   an arrival propagating device for propagating arrival times forward from each said primary input;
   an arrival potential marking device for marking as potentially necessary said in-edges to a node which cause an extreme arrival time at said node;
   a required propagating device for propagating required times backward from said test-edges;
   a required potential marking device for marking as potentially necessary said out-edges to a node which cause an extreme required time at said node; and
   a necessary marking device for marking as necessary edges which are included in a path to a primary output or a primary input, said path to said primary output or said primary input being composed only of edges marked potentially necessary.

9. A method of generating an abstract delay model for a circuit network comprising the steps of:
   a) inputting an original delay graph of said circuit network;
   b) marking with at least one type of necessary mark all delay edges in said original delay graph which contribute to an extreme delay path, said path having a delay and originating from a primary input of said original delay graph and proceeding through said circuit network;
   c) removing from said original delay graph all delay edges not marked as necessary in step b to produce a partially abstracted delay graph; said partially abstracted delay graph including at least one internal node having at least one in-edge and at least one out-edge from said marked delay edges;
   d) merging said at least one in-edge with at least one out-edge of said internal node, said out-edge having at least one of the same said type of necessary mark as said in-edge in said partially abstracted delay graph to form a new edge, if said merging decreases or does not change the number of said delay edges in said partially abstracted delay graph, to produce an abstracted delay graph wherein said delay of each of said at least one extreme delay path is preserved; and
   e) outputting said abstracted delay graph.

10. A method according to claim 9 wherein said original delay graph comprises test-edges, and said merging in step d further comprises the step of merging said in-edges with said test-edges.

11. A method according to claim 9 where said merging in step d further comprises the steps of: creating a new edge for an in-edge/out-edge pair at each said internal node; and connecting said new edge from a source of an in-edge in said in-edge/out-edge pair to a sink of an out-edge in said in-edge/out-edge pair.

12. A method according to claim 11 wherein a delay associated with said new edge is a sum of delays for all edges being merged.

13. A method according to claim 9 wherein said marking in step b further comprises the step of propagating arrival times forward from each said primary input, marking as potentially necessary said in-edges to a node which cause an extreme arrival time at said node, and marking as necessary edges which are included in a path to a primary output, said path to said primary output being composed only of edges marked potentially necessary.

14. A method according to claim 13 wherein said marking in step b further comprises the step of applying separate necessary marks to edges necessary for a maximum delay path and to edges necessary for a minimum delay path; and said merging in step d further comprises the steps of creating a new edge for an in-edge/out-edge pair at each said internal node which both have same said necessary marks; and connecting said new edge from a source of an in-edge from said in-edge/out-edge pair to a sink of an out-edge from said in-edge/out-edge pair.

15. A method according to claim 13 wherein said marking in step b further comprises the step of applying separate necessary marks to edges necessary for said extreme delay path from each said primary input; and said merging in step d further comprises the steps of creating a new edge for an in-edge/out-edge pair at each said internal node which both have same said necessary marks; and connecting said new edge from a source of an in-edge from said in-edge/out-edge pair to a sink of an out-edge from said in-edge/out-edge pair.

16. A method according to claim 10 wherein said marking in step b further comprises the steps of:

b1) propagating arrival times forward from each said primary input;

b2) marking as potentially necessary said in-edges to a node which cause an extreme arrival time at said node;

b3) propagating required times backward from said test-edges;

b4) marking as potentially necessary said out-edges to a node which cause an extreme required time at said node; and b5) marking as necessary, edges which are included in a path to a primary output or a primary input, said path to said primary output and said primary input being composed only of said in-edges and out-edges marked potentially necessary.

17. A delay abstraction system for a circuit network comprising:

a) means for inputting an original delay graph of said circuit network;

b) marking means for marking with at least one type of necessary mark all delay edges in said original gruel delay graph which contribute to at least one extreme delay path, each said path having a delay and originating from a primary input of said original delay graph and proceeding through said circuit network;

c) removing means for removing from said original delay graph all delay edges not marked as necessary by said marking means to produce a partially abstracted delay graph; said partially abstracted delay graph including at least one internal node having at least one in-edge and at least one out-edge from said marked delay edges;

d) merging means for merging said at least one in-edge with at least one out-edge of said internal node, said out-edge having at least one of the same said type of necessary mark as said in-edge, in said partially abstracted delay graph to form a new edge, if merging by said merging means decreases the number of said delay edges in said partially abstracted delay graph, to produce an abstracted delay graph wherein said delay of each of said at least one extreme delay path is preserved; and e) means for outputting said abstracted delay graph.

* * * * *